United States Patent
Chen et al.

(10) Patent No.: US 8,499,790 B2
(45) Date of Patent: Aug. 6, 2013

(54) ADJUSTABLE COOLANT QUICK COUPLER

(75) Inventors: Chien-An Chen, Taipei (TW); Wei-Ta Shih, Taipei (TW)

(73) Assignee: Inventec Corporation, Taipei (TW)

( * ) Notice: Subject to any disclaimer, the term of this patent is extended or adjusted under 35 U.S.C. 154(b) by 217 days.

(21) Appl. No.: 13/080,797

(22) Filed: Apr. 6, 2011

(65) Prior Publication Data

US 2012/0125448 A1 May 24, 2012

(30) Foreign Application Priority Data

Nov. 23, 2010 (TW) .............................. 99140365 A

(51) Int. Cl.
*F16L 37/23* (2006.01)

(52) U.S. Cl.
USPC .......................................... 137/614; 137/594

(58) Field of Classification Search
USPC ................ 137/594, 613, 614, 614.01–614.05
See application file for complete search history.

(56) References Cited

U.S. PATENT DOCUMENTS

| | | | |
|---|---|---|---|
| 4,991,627 A | 2/1991 | Nix | |
| 5,131,859 A | 7/1992 | Bowen et al. | |
| 5,464,042 A * | 11/1995 | Haunhorst | 137/595 |
| 6,860,290 B2 * | 3/2005 | Knuthson | 137/594 |
| 2004/0244848 A1 * | 12/2004 | Maldavs | 137/614.04 |
| 2006/0260699 A1 * | 11/2006 | Edelman et al. | 137/614.04 |
| 2010/0127198 A1 * | 5/2010 | Cozza | 251/149.1 |

FOREIGN PATENT DOCUMENTS

TW M375159 3/2010

* cited by examiner

*Primary Examiner* — Craig Schneider
*Assistant Examiner* — Reinaldo Sanchez-Medina
(74) *Attorney, Agent, or Firm* — WPAT, PC; Justin King

(57) ABSTRACT

An adjustable coolant quick coupler has a coolant supplier seat and a transmission seat that can be optionally connected or disconnected. The coolant supplier seat has a regulator assembly. The regulator assembly is able to adjust quantity of flow-in coolant and quantity of flow-out coolant. When the coolant supplier seat is connected to the transmission seat, the coolant can flow automatically from the coolant supplier seat to the transmission seat, so as to cool down electronic components inside a rack. When the coolant supplier seat is disconnected from the transmission seat, the coolant instantly stops flowing into the transmission seat. Because of the quick coupler, the rack installed inside a narrow space is convenient to set up or disassemble. Furthermore, by adjusting the quantity of flow-in coolant and the quantity of flow-out coolant, the electronic components can have a better effect of heat-dissipation.

8 Claims, 5 Drawing Sheets

ADJUSTABLE COOLANT QUICK COUPLER

BACKGROUND OF THE INVENTION

1. Field of Invention

The present invention relates to an adjustable coolant quick coupler, and more particularly to a coupler structure that can adjust flow quantity of a coolant and enable a mount and a coolant supplier to be quickly connected and disconnected without consuming excessive labor work or labor time.

2. Related Art

Currently, among various heat-dissipation methods for electronic products, a liquid-cooling heat-dissipation method is commonly seen and widely applied. In an existing liquid-cooling heat-dissipation device, pipelines are fixed in an electronic product and then connected to a coolant supplier.

The coolant supplier provides coolant to electronic components which need heat dissipation within the electronic product via the pipelines. Thus, heat exchange occurs between the coolant and the electronic components, so as to realize heat dissipation for the electronic components. Then, the coolant which is heated due to the heat exchange flows back to the coolant supplier and is further cooled down, so as to be used again in a next heat exchange cycle.

However, in the above liquid-cooling heat-dissipation device, the pipelines are fixed. If the electronic devices are configured densely, for example, a plurality of servers is configured within a fixed space, it can be imaged that too much labor time and labor work are consumed when the pipelines are being connected to or disconnected from the coolant supplier, and a lot of troubles and inconveniences are caused accordingly. Therefore, the existing liquid-cooling heat-dissipation devices still need to be improved to a large extent.

Furthermore, the flow quantity of the coolant, that is, the quantity of flow-in coolant and the quantity of flow-out coolant, has a constant value and cannot be changed. If the heat dissipation effect needs to be enhanced by changing the flow quantity, the existing liquid-cooling heat-dissipation device cannot realize the function.

SUMMARY OF THE INVENTION

In view of the above defects, the present invention is directed to an adjustable coolant quick coupler, in which a coolant supplier seat and a transmission seat are connected without using assemblies and are communicated with each other when being connected, so as to enable a coolant to flow through. The coolant supplier seat and the transmission seat can be disconnected independently without labor work. The coolant supplier seat and the transmission seat can respectively stop the flowing of the coolant automatically, so as to avoid leakage of the coolant. Through the connecting and disconnecting statuses between the coolant supplier seat and the transmission seat, the present invention can save labor work and labor time, and can be easily implemented. Furthermore, the flow quantity of the coolant is adjustable in the present invention, so as to achieve a better heat dissipation effect for electronic components.

In order to achieve the above objective, the present invention provides an adjustable coolant quick coupler, which comprises a coolant supplier seat, an intubation device, a transmission seat, a connecting device, and a regulator assembly. A side of the coolant supplier seat has a flow-in hole and a flow-out hole. The intubation device is disposed in the coolant supplier seat and used for optionally sealing the flow-out hole and the flow-in hole. The transmission seat is optionally connected to the coolant supplier seat. A side of the transmission seat has a fluid outlet hole and a fluid inlet hole. The connecting device is disposed in the transmission seat and used for being optionally connected to the intubation device, so that the fluid outlet hole is optionally communicated with the flow-in hole, and the fluid inlet hole is optionally communicated with the flow-out hole. The regulator assembly is disposed in the coolant supplier seat for respectively adjusting an opening of the flow-in hole and an opening of the flow-out hole.

An end of the coolant supplier seat has a tank and two positioning pillars. An other end of the coolant supplier seat has a flow-in channel, a flow-out channel, a flow-in quantity adjusting hole, and a flow-out quantity adjusting hole. The flow-in channel and the flow-out channel are respectively communicated with the tank. The flow-in hole is communicated with the flow-in channel. The flow-out hole is communicated with the flow-out channel. The flow-in quantity adjusting hole is communicated with the flow-in channel. The flow-out quantity adjusting hole is communicated with the flow-out channel.

The regulator assembly has a flow-in quantity adjusting button and a flow-out quantity adjusting button. An end of the flow-in quantity adjusting button is disposed in the flow-in quantity adjusting hole, corresponds to the flow-in hole, and has a flow guiding end. The flow-in quantity adjusting button is sleeved with a leak-proof washer. An other end of the flow-in quantity adjusting button has an adjusting portion. An end of the flow-out quantity adjusting button is disposed in the flow-out quantity adjusting hole, corresponds to the flow-out hole, and is sleeved with a leak-proof washer. An other end of the flow-out quantity adjusting button has an adjusting portion.

The intubation device has a stopper, a flow-in tube, a flow-out tube, an elastic, and a stop pillar. The stopper is disposed between the tank and the flow-in channel and the flow-out channel. An end of the flow-in tube is disposed in the flow-in channel and has an inlet hole. An other end of the flow-in tube passes through the stopper, extends into the tank, and has a plurality of outlet holes. The outlet holes are communicated with the inlet hole. The flow-in tube is sleeved with a plurality of leak-proof washers. An end of the flow-out tube is disposed in the flow-out channel, and has an outlet hole. An other end of the flow-out tube passes through the stopper, extends into the tank, and has a plurality of 25 inlet holes. The inlet holes are communicated with the outlet hole. The flow-out tube is sleeved with a plurality of leak-proof washers. The elastic and the stop pillar are disposed in the tank. An end of the elastic pushes against the stopper, and an other end of the elastic pushes against the stop pillar. The elastic may be a spring. The stop pillar has a first stop hole and a second stop hole. The first stop hole is provided for the end of the flow-in tube having the outlet holes to extend therein, so that the stop pillar can optionally seal the outlet holes of the flow-in tube. The second stop hole is provided for the end of the flow-out tube having the inlet holes to extend therein, so that the stop pillar can optionally seal the inlet holes of the flow-out tube.

An end of the transmission seat has a recess and two positioning holes. A side of the transmission seat has a fluid outlet hole and a fluid inlet hole, in which the fluid outlet hole and the fluid inlet hole are respectively communicated with the recess. Each positioning hole is optionally inserted by the corresponding positioning pillar.

The connecting device has a washer, two elastics, two flow retaining pillars, and a bearing pillar. The washer, the elastics, the flow retaining pillars, and the bearing pillar are disposed in the recess. The bearing pillar has a first hole and a second hole at positions respectively corresponding to the fluid outlet hole and the fluid inlet hole. The bearing pillar has a liquid flow-out hole and a liquid flow-in hole in a periphery thereof at positions respectively corresponding to the fluid outlet hole and the fluid inlet hole. The liquid flow-out hole is communicated with the first hole, and the liquid flow-in hole is communicated with the second hole. The bearing pillar is sleeved with a leak-proof washer.

The flow retaining pillars are respectively disposed in the first hole and the second hole, so as to optionally seal the first hole, the second hole, the liquid flow-out hole, and the liquid flow-in hole. The flow retaining pillars are sleeved with leak-proof washers. An end of each elastic pushes against the washer, an other end of the elastic pushes against the flow retaining pillar, and the elastic may be a spring.

A side of the transmission seat having the fluid outlet hole and the fluid inlet hole is further disposed with a switching part, in which the switching part has a fluid inlet tube communicated with the fluid inlet hole and a fluid outlet tube communicated with the fluid outlet hole.

With the above structure, the coolant supplier seat may be connected to a coolant supplier, and the transmission seat may be connected to a rack, in which the rack comprises electronic components which need heat dissipation. When the coolant supplier seat is connected to the transmission seat, the corresponding holes of the coolant supplier seat and the transmission seat are conducted, so that the coolant flows into the rack, so as to realize heat dissipation for the electronic components, and then the coolant flows back to the coolant supplier, so as to be used gain next time.

When the coolant supplier seat is disconnected from the transmission seat, the above conducted holes are all sealed, so as to avoid leakage of the coolant.

Furthermore, because of the characteristic that the coolant supplier seat and the transmission seat can be easily connected or disconnected, the rack that is installed inside a narrow space can be conveniently connected to or disconnected from the coolant supplier without consuming excessive labor time or labor work.

In addition, the flow-out quantity adjusting button and the flow-in quantity adjusting button of the regulator assembly can respectively change quantity of flow-in coolant and quantity of flow-out coolant. If a large amount of coolant is required to supply to the electronic components, and the coolant is required to flow out at a low rate, the flow-out quantity adjusting button and the flow-out quantity adjusting button can be adjusted to change the opening of the flow-in hole and the opening of the flow-out hole, thereby changing the quantity of flow-in coolant and the quantity of flow-out coolant, thus achieving a better effect of heat dissipation for the electronic components.

DETAILED DESCRIPTION OF THE INVENTION

The implementation of the present invention is described below through specific embodiments, and those skilled in the art can easily understand other advantages and efficacy of the present invention based on the disclosure of the specification.

Figure 1:
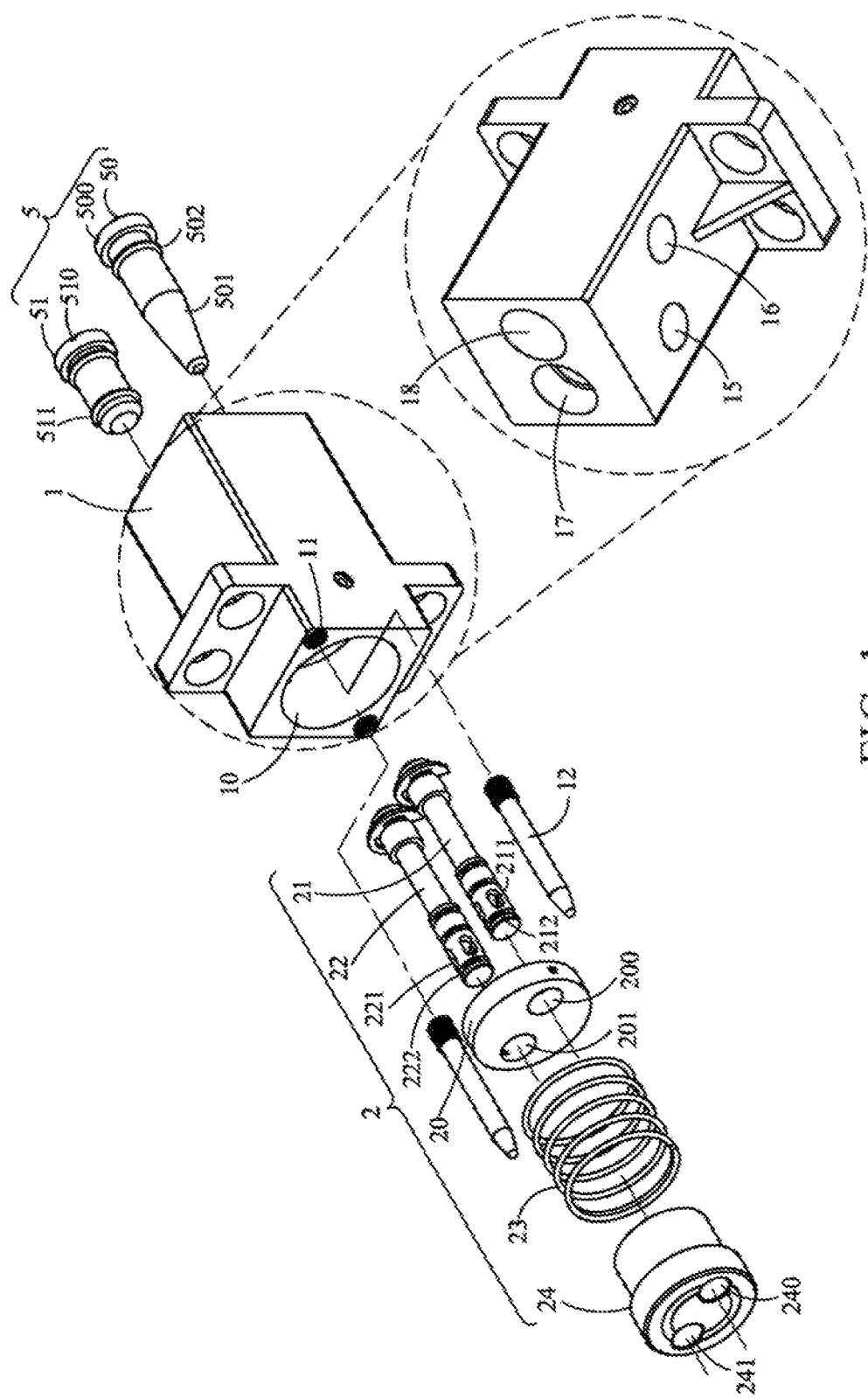
FIG. 1 is a three-dimensional exploded view of a coolant supplier seat and an intubation device in an adjustable coolant quick coupler according to the present invention.
Figure 2:
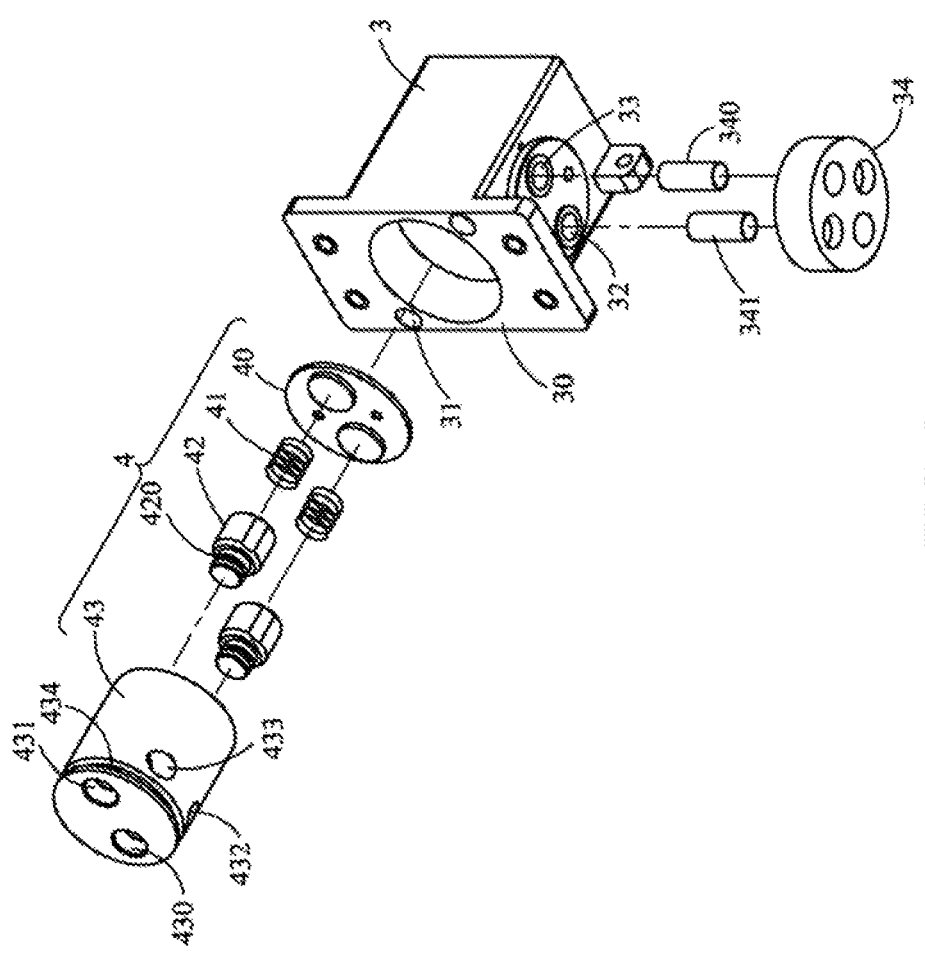
FIG. 2 is a three-dimensional exploded view of a transmission seat and a connecting device in an adjustable coolant quick coupler according to the present invention.
Figure 3:
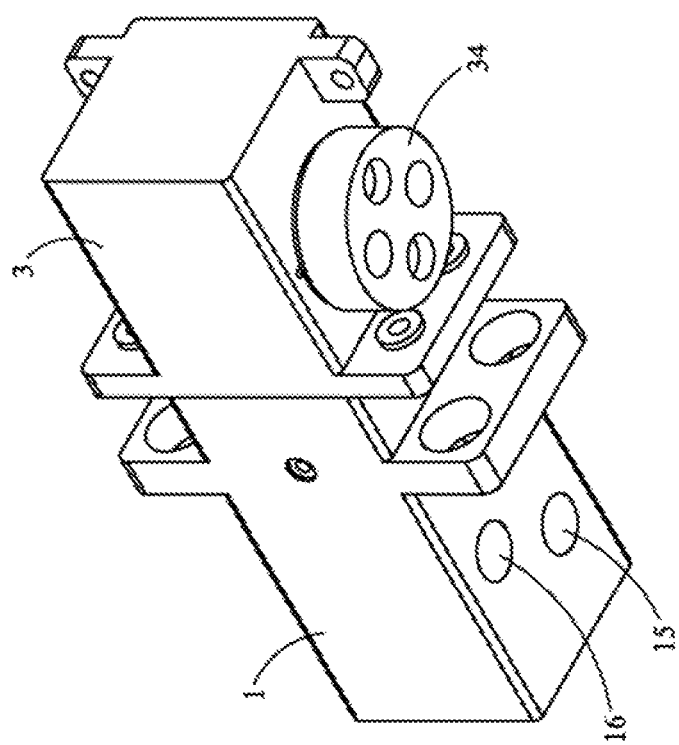
FIG. 3 is a three-dimensional outside view of an adjustable coolant quick coupler according to the present invention.

Referring to FIG. 1, FIG. 2, and FIG. 3, the present invention provides an adjustable coolant quick coupler, which includes a coolant supplier seat 1, an intubation device 2, a transmission seat 3, a connecting device 4, and a regulator assembly 5.

Figure 4:
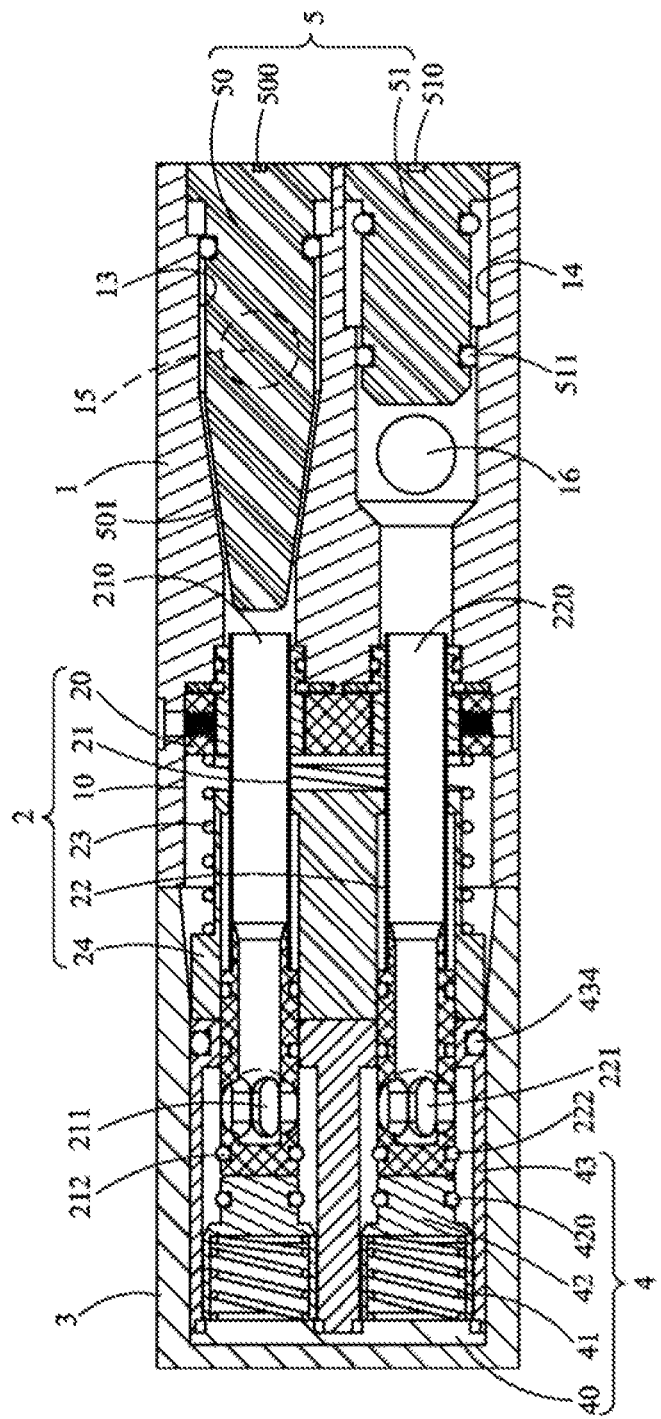
FIG. 4 is a schematic sectional view of an adjustable coolant quick coupler according to the present invention.

An end of the coolant supplier seat 1 is provided with a tank 10 and two holes 11. The two holes 11 are respectively located at two opposite angles of the tank 10, and each hole 11 has a positioning pillar 12. Referring to FIG. 4, an other end of the coolant supplier seat 1 is provided with a flow-in channel 13 and a flow-out channel 14, which are respectively communicated with the tank 10. A side of the coolant supplier seat 1 has a flow-in hole 15 and a flow-out hole 16, in which the flow-in hole 15 is communicated with the flow-in channel 13, and the flow-out hole 16 is communicated with the flow-out channel 14. An other end of the coolant supplier seat 1 further has a flow-in quantity adjusting hole 17 and a flow-out quantity adjusting hole 18, in which the flow-in quantity adjusting hole 17 is communicated with the flow-in channel 13, and the flow-out quantity adjusting hole 18 is communicated with the flow-out channel 14.

The intubation device 2 has a stopper 20, a flow-in tube 21, a flow-out tube 22, an elastic 23, and a stop pillar 24.

The stopper 20 is disposed between the tank 10 and the flow-in channel 13 and the flow-out channel 14. The stopper 20 has a first through hole 200 and a second through hole 201 respectively corresponding to the flow-in channel 13 and the flow-out channel 14.

An end of the flow-in tube 21 is disposed in the flow-in channel 13 and has an inlet hole 210. An other end of the flow-in tube 21 passes through the first through hole 200, extends into the tank 10, and has a plurality of outlet holes 211. The outlet holes 211 are communicated with the inlet hole 210. The flow-in tube 21 is sleeved with a plurality of leak-proof washers 212.

An end of the flow-out tube 22 is disposed in the flow-out channel 14 and has an outlet hole 220. An other end of the flow-out tube 22 passes through the second through hole 201, extends into the tank 10, and has a plurality of inlet holes 221. The inlet holes 221 are communicated with the outlet hole 220. The flow-out tube 22 is sleeved with a plurality of leak-proof washers 222.

The elastic 23 and the stop pillar 24 are disposed in the tank 10. The elastic 23 may be a spring. An end of the elastic 23 pushes against the stopper 20, and an other end of the elastic 23 pushes against the stop pillar 24. The stop pillar 24 has a first stop hole 240 and a second stop hole 241. The first stop hole 240 is provided for the end of the flow-in tube 21 having the outlet holes 211 to extend therein, so that the stop pillar 24 can optionally seal the outlet holes 211. The leak-proof washers 212 generate a better sealing effect between the first stop hole 240 and the flow-in tube 21. The second stop hole 241 is provided for the end of the flow-out tube 22 having the inlet holes 221 to extend therein, so that the stop pillar 24 can optionally seal the inlet holes 221. The leak-proof washers 222 generate a better sealing effect between the second stop hole 241 and the flow-out tube 22.

An end of the transmission seat 3 has a recess 30 and two positioning holes 31. The positioning holes 31 are located at two opposite angles of the recess 30, and each positioning hole 31 can be optionally inserted by the corresponding positioning pillar 12, so as to connect and position the coolant supplier seat 1 and the transmission seat 3. A side of the transmission seat 3 has a fluid outlet hole 32 and a fluid inlet hole 33, which are respectively communicated with the recess 30. The side of the transmission seat 3 further has a switching part 34, in which the switching part 34 has a fluid inlet tube 340 communicated with the fluid inlet hole 33 and a fluid outlet tube 341 communicated with the fluid outlet hole 32.

The connecting device 4 has a washer 40, two elastics 41, two flow retaining pillars 42, and a bearing pillar 43. The washer 40, the elastics 41, the flow retaining pillars 42, and the bearing pillar 43 are disposed in the recess 30.

The bearing pillar 43 has a first hole 430 and a second hole 431 at positions respectively corresponding to the fluid outlet hole 32 and the fluid inlet hole 33. The bearing pillar 43 has a liquid flow-out hole 432 and a liquid flow-in hole 433 in a periphery thereof at positions corresponding to the fluid outlet hole 32 and the fluid inlet hole 33. The liquid flow-out hole 432 is communicated with the first hole 430, and the liquid flow-in hole 433 is communicated with the second hole 431. The bearing pillar 43 is sleeved with a leak-proof washer 434, so as to generate a better sealing effect between the bearing pillar 43 and the recess 30.

The two flow retaining pillars 42 are respectively disposed in the first hole 430 and the second hole 431, and used for optionally sealing the first hole 430, the second hole 431, the liquid flow-out hole 432, and the liquid flow-in hole 433. An end of each elastic 41 pushes against the washer 40, and an other end of the elastic 41 pushes against the corresponding flow retaining pillar 42. The elastic 41 may be a spring. The flow retaining pillars 42 are sleeved with leak-proof washers 420, so as to generate a better sealing effect between the flow retaining pillars 42 and the first hole 430 and the second hole 431.

The regulator assembly 5 has a flow-in quantity adjusting button 50 and a flow-out quantity adjusting button 51. An end of the flow-in quantity adjusting button 50 is disposed in the flow-in quantity adjusting hole 17, corresponds to the flow-in hole 15, and has a flow guiding end 501. An other end of the flow-in quantity adjusting button 50 has an adjusting portion 500. The flow-in quantity adjusting button 50 is sleeved with a leak-proof washer 502, so as to avoid leakage at the flow-in quantity adjusting hole 17.

An end of the flow-out quantity adjusting button 51 is disposed in the flow-out quantity adjusting hole 18, corresponds to the flow-out hole 16. An other end of the flow-out quantity adjusting button 51 has an adjusting portion 510. The flow-out quantity adjusting button 51 is sleeved with the leak-proof washer 510, so as to avoid leakage at the flow-out quantity adjusting hole 18.

Referring to FIG. 4, the coolant supplier seat 1 may be connected to one coolant supplier, and the transmission seat 3 may be connected to a rack having electronic components that need heat dissipation. When the coolant supplier seat 1 is connected to the transmission seat 3, the positioning pillar 12 is inserted into the positioning hole 31, so that the transmission seat 3 and the coolant supplier seat 1 are well positioned and connected with each other.

An end portion of the stop pillar 24 is pushed against by the bearing pillar 43, so that the stop pillar 24 is withdrawn into the tank 10, and compresses the elastic 23. An end of the flow-in tube 21 having the outlet holes 211 is inserted into the first hole 430, so that the flow retaining pillar 42 located in the first hole 430 is withdrawn into the recess 30, and compress the elastic 41, so that the outlet holes 211 are communicated with the fluid outlet hole 32.

Similarly, the end of the flow-out tube 22 having the inlet holes 221 is inserted into the second hole 431, so that the stop pillar 24 is withdrawn into the recess, and the inlet holes 221 are communicated with the fluid inlet hole 33.

Coolant at a low temperature from the coolant supplier flows through the flow-in hole 15, the inlet hole 210, the flow-in tube 21, the outlet holes 211, the liquid flow-out hole 432, the fluid outlet hole 32, and the fluid outlet tube 341, so as to reach the electronic components that need heat dissipation, so that heat exchange occurs between the coolant and the electronic components. Thus, the electronic components dissipate heats and are cooled down, and then after the heat exchange, the coolant turns into coolant at a high temperature.

The coolant at a high temperature flows through the fluid inlet tube 340, the fluid inlet hole 33, the liquid flow-in hole 433, the inlet holes 221, the flow-out tube 22, the outlet hole 220, and the flow-out hole 16, so as to flow back to the coolant supplier, so that the coolant at a high temperature is cooled down to become coolant at a low temperature, which is used for a next heat exchange cycle.

When the rack needs to be disconnected from the coolant supplier, the coolant supplier seat 1 and the transmission seat 3 are directly disconnected from each other, and then the compressed elastics 23 and 41 respectively force the stop pillar 24 and the flow retaining pillars 42 to return to the initial positions, and the stop pillar 24 seals the outlet holes 211 of the flow-in tube 21 and the inlet holes 221 of the flow-out tube 22, and the flow retaining pillars 42 seal the first hole 430, the second hole 431, the liquid flow-out hole 432, and the liquid flow-in hole 433, thereby stopping the flowing of the coolant, and preventing leakage of the coolant when the rack is disconnected from the coolant supplier.

Figure 5:
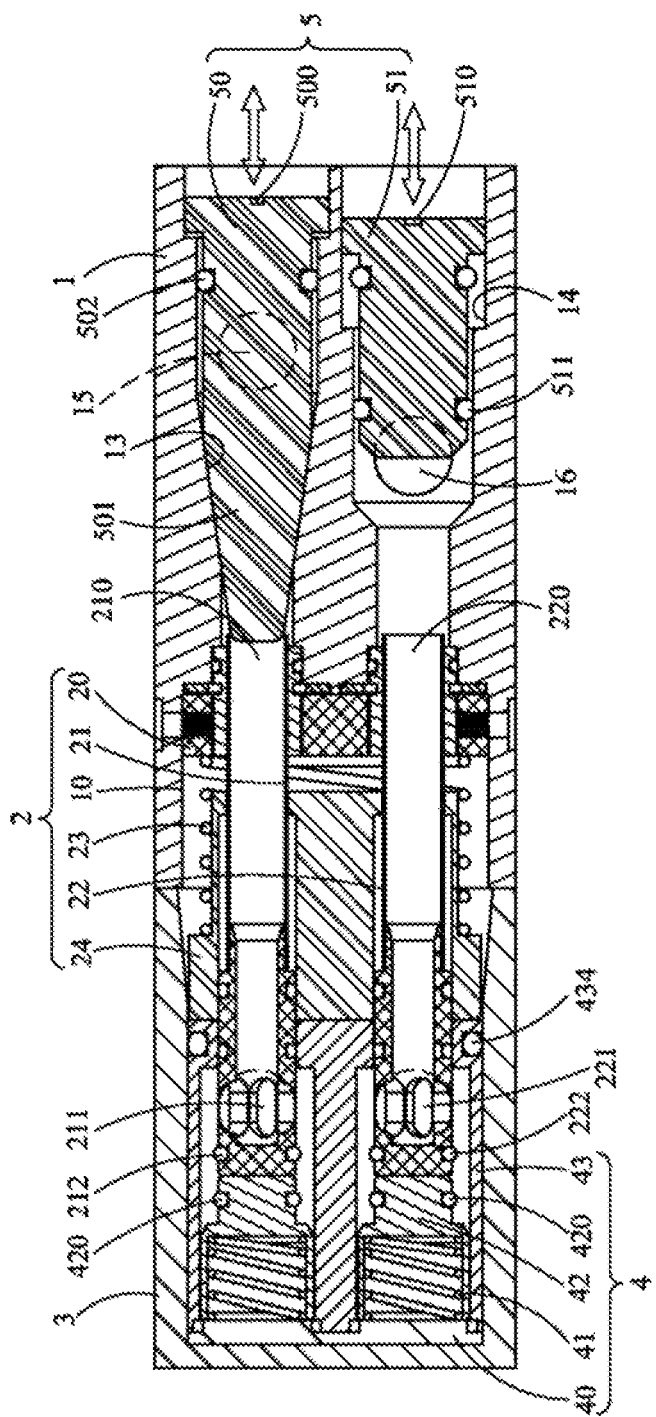
FIG. 5 is a schematic sectional view of motions of an adjustable coolant quick coupler according to the present invention.

In addition, referring to FIG. 5, when the coolant flows in the coolant supplier seat 1 and the transmission seat 3, by using certain tools to combine with the adjusting portions 500 and 510, the position of the flow guiding end 501 in the flow-in channel 13 can be adjusted, so as to further control the opening of the flow-in hole 15, or the position of the flow-out quantity adjusting button 51 in the flow-out channel 14 can be adjusted, so as to further control the opening of the flow-out hole 16, thereby controlling and changing the quantity of flow-out coolant and the quantity of flow-in coolant, and achieving a better effect of heat dissipation for the electronic components.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An adjustable coolant quick coupler, comprising: a coolant supplier seat, having a flow-in hole and a flow-out hole at a side, a tank at an end, and a flow-in channel and a flow-out channel at the other end, wherein the flow-in channel and the flow-out channel are respectively communicated with the tank, the flow-in hole is communicated with the flow-in channel, and the flow-out hole is communicated with the flow-out channel; an intubation device, disposed in the coolant supplier seat, and used for optionally sealing the flow-in hole and the flow-out hole, having a stopper, a flow-in tube, a flow-out tube, an elastic, and a stop pillar, the stopper is disposed between the tank and the flow-in channel and the flow-out channel, an end of the flow-in tube is disposed in the flow-in channel and has an inlet hole, an other end of the flow-in tube passes through the stopper, extends into the tank, and has a plurality of outlet holes, and the outlet holes are communicated with the inlet hole, an end of the flow-out tube is disposed in the flow-out channel and has an outlet hole, and the other end of the flow-out tube passes through the stopper, extends into the tank, and has a plurality of inlet holes, the inlet holes are communicated with the outlet hole, the elastic and the stop pillar are disposed in the tank, an end of the elastic pushes against the stopper, an other end of the elastic pushes against the stop pillar, the stop pillar has a first stop hole and a second stop hole, the first stop hole is provided for the end of the flow-in tube having the outlet holes to extend therein, so that the stop pillar optionally seals the outlet holes of the flow-in tube, and the second stop hole is provided for the end of the flow-out tube having the inlet holes to extend therein, so that the stop pillar optionally seals the inlet holes of the flow-out tube; a transmission seat, used for being optionally connected to the coolant supplier seat, wherein a side of the transmission seat has a fluid outlet hole and a fluid inlet hole; a connecting device, disposed in the transmission seat, and used for being optionally connected to the intubation device, so that the fluid outlet hole is optionally communicated with the flow-in hole, and the fluid inlet hole is optionally communicated with the flow-out hole, and a regulator assembly, disposed in the coolant supplier seat, and used for adjusting an opening of the flow-in hole and an opening of the flow-out hole respectively.

2. The adjustable coolant quick coupler according to claim 1, wherein the other end of the coolant supplier seat has a flow-out quantity adjusting hole and a flow-in quantity adjusting hole, the flow-in quantity adjusting hole is communicated with the flow-in channel, the flow-out quantity adjusting hole is communicated with the flow-out channel, the regulator assembly has a flow-in quantity adjusting button and a flow-out quantity adjusting button, an end of the flow-in quantity adjusting button is disposed in the flow-in quantity adjusting hole, corresponds to the flow-in hole, and has a flow guiding end, and an end of the flow-out quantity adjusting button is disposed in the flow-out quantity adjusting hole and corresponds to the flow-out hole.

3. The adjustable coolant quick coupler according to claim 2, wherein the flow-out tube is sleeved with a plurality of leak-proof washers, the flow-in tube is sleeved with a plurality of leak-proof washers, the elastic is a spring, the flow-out quantity adjusting button is sleeved with a leak-proof washer, and the flow-in quantity adjusting button is sleeved with a leak-proof washer.

4. The adjustable coolant quick coupler according to claim 2, wherein an other end of the flow-out quantity adjusting button has an adjusting portion, and an other end of the flow-in quantity adjusting button has an adjusting portion.

5. The adjustable coolant quick coupler according to claim 1, wherein an end of the transmission seat has a recess, the fluid outlet hole and the fluid inlet hole are respectively communicated with the recess, the connecting device has a washer, two elastics, two flow retaining pillars, and a bearing pillar, and the washer, the elastics, the flow retaining pillars, and the bearing pillar are disposed in the recess, the bearing pillar has a first hole and a second hole at positions respectively corresponding to the fluid outlet hole and the fluid inlet hole, the bearing pillar has a liquid flow-out hole and a liquid flow-in hole in a periphery thereof at positions respectively corresponding to the fluid outlet hole and the fluid inlet hole, the liquid flow-out hole is communicated with the first hole, and the liquid flow-in hole is communicated with the second hole, the flow retaining pillars are respectively disposed in the first hole and the second hole, and optionally seal the first hole, the second hole, the liquid flow-out hole, and the liquid flow-in hole, an end of each elastic pushes against the washer, and an other end of the elastic pushes against the flow retaining pillar.

6. The adjustable coolant quick coupler according to claim 5, wherein the bearing pillar is sleeved with a leak-proof washer, each flow retaining pillar is sleeved with a leak-proof washer, and each elastic is a spring.

7. The adjustable coolant quick coupler according to claim 1, wherein the side of the transmission seat having the fluid outlet hole and the fluid inlet hole is further disposed with a switching part, and the switching part has a fluid inlet tube communicated with the fluid inlet hole and a fluid outlet tube communicated with the fluid outlet hole.

8. The adjustable coolant quick coupler according to claim 1, wherein an end of the coolant supplier seat has two positioning pillars, an end of the transmission seat has two positioning holes, and each positioning pillar is optionally inserted into a positioning hole corresponding thereto.

* * * * *